(12) United States Patent
Blackwell et al.

(10) Patent No.: US 11,482,521 B2
(45) Date of Patent: Oct. 25, 2022

(54) INTEGRATED CIRCUIT WITH P-N-P JUNCTION AND VERTICALLY ALIGNED FIELD EFFECT TRANSISTOR, AND METHOD TO FORM SAME

(71) Applicant: GLOBALFOUNDRIES U.S. Inc., Santa Clara, CA (US)

(72) Inventors: Don R. Blackwell, Santa Clara, CA (US); Peter P. Hang, Santa Clara, CA (US); Van Ton-That, San Jose, CA (US); Timothy S. Miller, Saratoga, CA (US)

(73) Assignee: GlobalFoundries U.S. Inc., Santa Clara, CA (US)

( * ) Notice: Subject to any disclaimer, the term of this patent is extended or adjusted under 35 U.S.C. 154(b) by 15 days.

(21) Appl. No.: 16/783,692

(22) Filed: Feb. 6, 2020

(65) Prior Publication Data

US 2021/0249406 A1 Aug. 12, 2021

(51) Int. Cl.
*H01L 29/735* (2006.01)
*H01L 27/07* (2006.01)
(Continued)

(52) U.S. Cl.
CPC ........ *H01L 27/0722* (2013.01); *H01L 21/326* (2013.01); *H01L 21/8249* (2013.01);
(Continued)

(58) Field of Classification Search
CPC .................................................. H01L 27/0722
See application file for complete search history.

(56) References Cited

U.S. PATENT DOCUMENTS

2009/0026542 A1* 1/2009 Wahl ................... H01L 27/1203
257/350
2014/0015052 A1* 1/2014 Fenouillet-Beranger ....................
H01L 27/0296
257/348
(Continued)

FOREIGN PATENT DOCUMENTS

| CN | 113224053 A | 8/2021 |
|----|-------------|--------|
| DE | 102020133745 A1 | 8/2021 |
| TW | 202145500 A | 12/2021 |

OTHER PUBLICATIONS

Lechevallier et al., "A Forward-Body-Bias Tuned 450MHz Gm-C 3rd-Order Low-Pass Filter in 28nm UTBB FD-SOI with >1dBVp IIP3 over a 0.7-to-1V Supply," STMicroelectronics, Crolles, France, retrieved on Jan. 3, 2020 from citeseerx.ist.psu.edu > viewdoc > download.

(Continued)

*Primary Examiner* — Benjamin P Sandvik
(74) *Attorney, Agent, or Firm* — David Cain; Hoffman Warnick LLC (57) ABSTRACT

Embodiments of the disclosure provide an integrated circuit (IC) structure, including: a p-type substrate, a p-well region within the p-type substrate, and an n-type barrier region between the p-type substrate and the p-well region. The n-type barrier region physically isolates the p-type substrate from the p-well region. A field effect transistor (FET) is positioned above the p-well region, and a buried insulator layer on the upper surface of the p-well region separates the transistor from the p-well region. A first voltage source electrically coupled to the p-well region induces a P-N-P junction across the p-well region, the n-type barrier region, and the p-type substrate.

20 Claims, 4 Drawing Sheets

(51) Int. Cl.
    *H01L 29/06*          (2006.01)
    *H01L 29/10*          (2006.01)
    *H01L 21/326*        (2006.01)
    *H01L 29/417*        (2006.01)
    *H01L 29/66*          (2006.01)
    *H01L 21/8249*      (2006.01)

(52) U.S. Cl.
    CPC ...... *H01L 29/0649* (2013.01); *H01L 29/1079* (2013.01); *H01L 29/41708* (2013.01); *H01L 29/6625* (2013.01); *H01L 29/735* (2013.01)

(56) References Cited

U.S. PATENT DOCUMENTS

| | | | | |
|---|---|---|---|---|
| 2015/0001634 A1* | 1/2015 | Ciavatti | ............. | H01L 29/0804 438/234 |
| 2017/0248543 A1* | 8/2017 | Monfray | ............ | G01N 27/4145 |
| 2017/0338343 A1* | 11/2017 | Baudot | .................. | H01L 21/76 |

OTHER PUBLICATIONS

Stark et al., "Comparison of SOI Power device structures in power converters for high-voltage, low-charge electrostatic microgenerators," IEEE vol. 52, Issue 7, Jul. 2005, retrieved from: https://ieeexplore.ieee.org/document/1459131?reload=true&arnumber=1459131 on Jan. 3, 2020, abstract only, 2 pages.

Awad et al., "Performance Comparison of Two Stage of Dickson Voltage Rectifier Realized in FD-SOI 28nm and BiCMOS 55nm for RF Energy Harvesting," IEEE, conference dated Jun. 2018, retrieved from: https://ieeexplore.ieee.org/document/8439412 on Jan. 3, 2020, abstract only, 2 pages.

\* cited by examiner

INTEGRATED CIRCUIT WITH P-N-P JUNCTION AND VERTICALLY ALIGNED FIELD EFFECT TRANSISTOR, AND METHOD TO FORM SAME

TECHNICAL FIELD

Embodiments of the disclosure relate generally to integrated circuits (ICs). More specifically, the disclosure relates to an integrated circuit (IC) structure with a P-N-P junction vertically aligned with a field effect transistor (FET), and methods to form the P-N-P junction vertically separated from the FET in the IC structure.

BACKGROUND

In the microelectronics industry as well as in other industries involving construction of microscopic structures, there is a continued desire to reduce the size of structural features and microelectronic devices and/or to provide a greater amount of circuitry for a given chip size. Miniaturization in general allows for increased performance (more processing per clock cycle and less heat generated) at lower power levels and lower cost. Present technology is at atomic level scaling of certain micro-devices such as logic gates, FETs, and capacitors. Circuit chips with hundreds of millions of such devices are common.

Circuit fabricators are currently seeking to reduce the two-dimensional area occupied by device components, e.g., to reduce two dimensional area and power consumption. As circuit components continue to shrink, greater numbers of devices may be formed in close proximity. However, circuit design often permits only one device component per layer. Conventional devices offer a limited ability to stack multiple device components in a single layer. Where vertical stacking of components is possible, such components may include only capacitors stacked over passive or active devices, and/or complementary metal oxide semiconductor (CMOS) transistors formed over a doped well region.

SUMMARY

A first aspect of the present disclosure provides an integrated circuit (IC) structure, including: a p-type substrate; a p-well region within the p-type substrate; an n-type barrier region between the p-type substrate and the p-well region, wherein the n-type barrier region physically isolates the p-type substrate from the p-well region; a field effect transistor (FET) above the p-well region, wherein a buried insulator layer separates the transistor from the p-well region; and a first voltage source electrically coupled to the p-well region inducing a P-N-P junction across the p-well region, the n-type barrier region, and the p-type substrate.

A second aspect of the present disclosure provides an integrated circuit (IC) structure including: a bipolar junction transistor (BJT) including: a p-type substrate; a p-well region within the p-type substrate; an n-type barrier region between the p-type substrate and the p-well region, wherein the n-type barrier region physically isolates the p-type substrate from the p-well region; a first voltage source electrically coupled to the p-well region inducing a P-N-P junction across the p-well region, the n-type barrier region, and the p-type substrate to define collector, base, and emitter terminals of the BJT; a buried insulator layer above the p-well region of the BJT; and a field effect transistor (FET) on the buried insulator layer above the p-well region, and including a semiconductor channel region above the buried insulator layer, wherein the semiconductor channel is positioned vertically above the P-N-P junction.

A third aspect of the present disclosure provides a method to form a bipolar junction transistor (BJT) in vertical alignment with a field effect transistor (FET), the method including: providing a structure including: a p-type substrate, a p-well region within the p-type substrate, an n-type barrier region between the p-type substrate and the p-well region, wherein the n-type barrier region physically isolates the p-type substrate from the p-well region, a buried insulator layer above the substrate, and a field effect transistor (FET) above the buried insulator layer; applying a forward bias to the p-well region, wherein applying the forward bias induces a P-N-P junction across the p-well region, the n-type barrier region, and the p-type substrate.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

Embodiments of the disclosure provide an integrated circuit (IC) structure having a P-N-P junction vertically beneath a field effect transistor (FET). The P-N-P junction may operate as a bipolar junction transistor (BJT) during operation. Embodiments of the disclosure can cause the FET and BJT to be vertically aligned with each other in a single device layer. In this context, "vertically aligned" or "vertical alignment" refers to a FET being positioned vertically above two P-N junctions, which together form the P-N-P junction and are at least partially horizontally overlapping relative to a source-to-drain electrical pathway across the FET. A P-N junction is a device structure in which p-type and n-type semiconductor regions are brought into contact with each other, thereby creating a potential barrier. The size of the barrier is determined by the bias applied between the p-type and n-type regions. Two types of P-N junctions are possible. A homojunction is a junction between p-type and n-type regions formed in one semiconductor material. A heterojunction is a junction between p-type and n-type regions formed between two different semiconductor materials.

A P-N junction, when formed in a device, may operate as a diode. A diode is a two-terminal element which behaves differently from conductive or insulative materials between two points of electrical contact. Specifically, a diode provides high conductivity from one contact to the other in one direction (i.e., the "forward" direction) but provides little to no conductivity in the opposite direction (i.e., the "reverse" direction). In the case of the P-N junction, the orientation of a diode's forward and reverse directions may be contingent on the type and magnitude of bias applied to the material composition of one or both terminals, which affect the size of the potential barrier. In the case of a junction between two semiconductor materials, the potential barrier will be formed along the interface between the two semiconductor materials. IC structures according to the disclosure, and related methods, include the application of varying biases to doped semiconductor materials to create a BJT within selected portions of a device layer.

Figure 1:
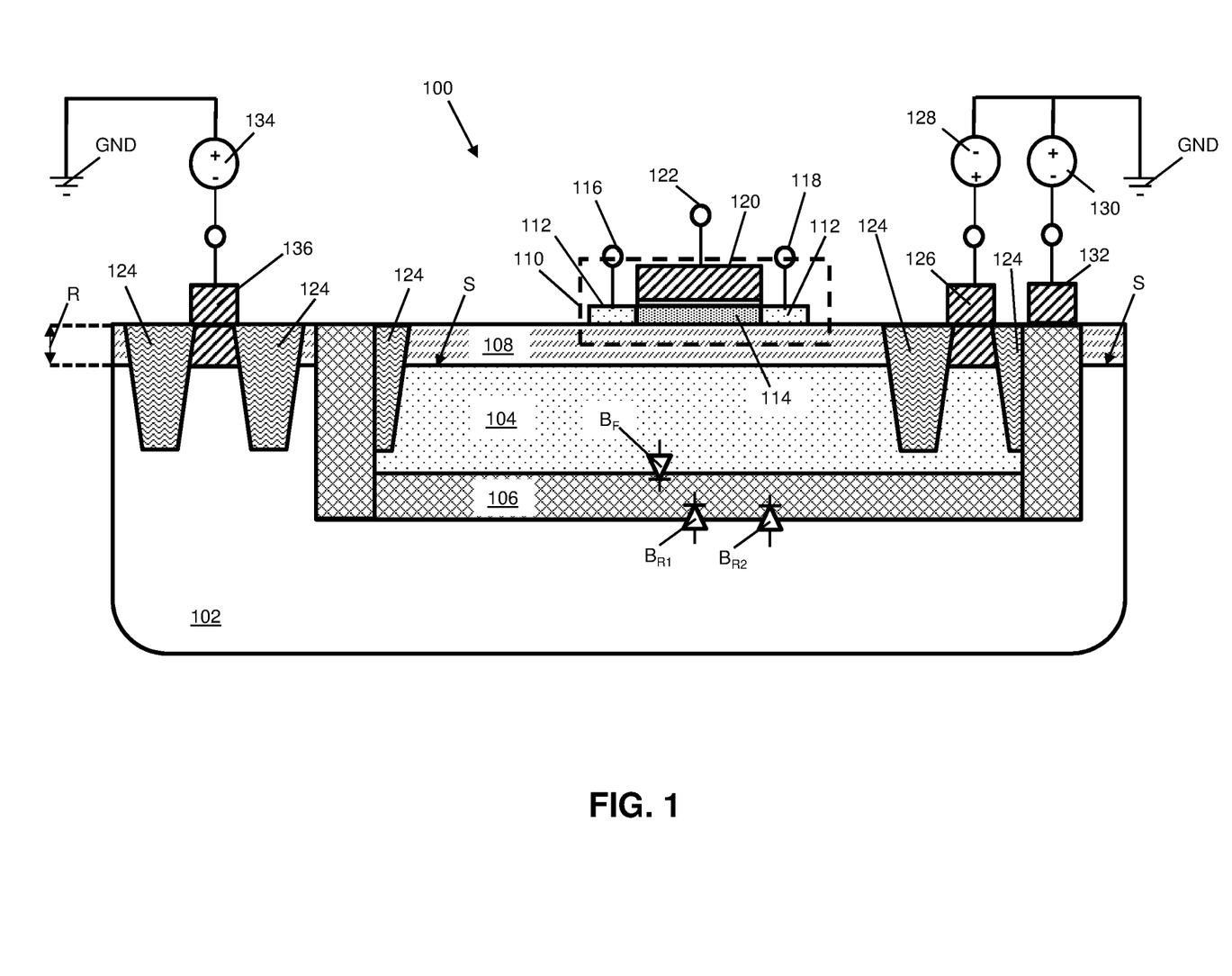
FIG. 1 shows a cross-sectional diagram of an integrated circuit (IC) structure to form a P-N-P junction vertically aligned with a field effect transistor (FET) according to embodiments of the disclosure.

Referring to FIG. 1, an IC structure 100 (simply "structure" hereafter) according to embodiments of the disclosure is shown. Structure 100 may be formed from a substrate 102 including, e.g., one or more semiconductor materials. Substrate 102 can include any currently known or later-developed semiconductor material, which may include without limitation, silicon, germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). The entirety of substrate 102 or a portion thereof may be strained.

Substrate 102 may be implanted with p-type dopants. P-type dopants refer to elements introduced into semiconductor material to generate free holes by "accepting" electrons from a semiconductor atom and consequently "releasing" the hole. The acceptor atom must have one valence electron less than the host semiconductor. P-type dopants suitable for use in p-type substrate 102 may include but are not limited to: boron (B), indium (In) and gallium (Ga). Boron (B) is the most common acceptor in silicon technology. Further alternatives include indium and gallium (Ga). Gallium (Ga) features high diffusivity in silicon dioxide ($SiO_2$), and hence, the oxide cannot be used as a mask during Ga diffusion. Structure 100 may also include a p-well region 104 formed within substrate 102, e.g., by vertical ion implantation, such that an upper surface S of p-well region 104 is aligned, and thus shared, with the upper surface of substrate 102. Although p-well region 104 may have the same doping type as substrate 102, p-well region 104 may have a higher or lower dopant concentration than substrate 102. P-well region 104 thus may be distinguished from substrate 102 at least partially based on its doping concentration, dopant materials, etc., even where p-well region 104 and substrate 102 are of the same doping type.

To form a three terminal P-N-P junction for a BJT as discussed herein, structure 100 may include an n-type doped barrier region 106 (simply "barrier region" hereafter) between substrate 102 and p-well region 104. Barrier region 106 may be formed within substrate 102 before p-well region 104 is formed, and p-well region 104 in such cases may be formed within barrier region 106. In any case, barrier region 106 may be formed within substrate 102 to a depth less than the total thickness of substrate 102, but may have an upper surface coincident with upper surface S of p-well region 104. Barrier region 106 may be formed by implanting n-type dopants into substrate 102 and/or precursor semiconductor material by any currently known or later developed technique, e.g., ion implantation. N-type dopants are elements introduced into semiconductor materials to generate free electrons, e.g., by "donating" an electron to semiconductor. N-type dopants must have one more valance electron than the semiconductor. Common N-type donors in silicon (Si) include, e.g., phosphorous (P), arsenic (As), and/or antimony (Sb).

Transistors (e.g., FET 110 discussed herein) and/or other devices may be formed on P-well region 104 to drive various operations of a device, e.g., logic, electrical functions, etc. In structure 100, p-well region 104 may act as a back-gate region for controlling the electrical properties of a transistor formed thereon. A buried insulator layer 108, also known in the art as a "buried oxide" or "BOX" layer, can separate p-well region 104, as well as substrate 102 and barrier layer 106 where applicable, from overlying portions of a transistor structure, such as FET 110. Buried insulator layer 108 may be composed of one or more oxide compounds, and/or any other currently known or later-developed electrically insulative substances. Buried insulator layer 108 may be sized as narrow as possible to provide better interaction with p-well region 104, and in various embodiments may have a thickness R that is at most approximately twenty-five nanometers (nm). Where transistors formed on buried insulator layer 108 also feature functional components of a similar thickness scale, structure 100 may be considered to be a "fully depleted semiconductor on insulator" (FDSOI) structure. The use of FDSOI technology provides various advantages such as an adjustable electric transistor potential by applying a bias to p-well region 104.

A field effect transistor (FET) 110, indicated with a phantom border, may be formed over buried insulator layer 108, such that buried insulator layer 108 physically separates FET 110 from p-well region 104. FET 110 may take the form of a three-terminal transistor according to any one of several device architectures. FET 110 is shown for the purposes of example as being a planar FET, but it is understood that various embodiments of the disclosure may also include FET(s) 110 in the form of fin-type FETs ("FinFETs"), nanosheet transistors, vertically-oriented FET(s) ("VFETs"), and/or any other currently known or later developed transistor architecture. Buried insulator layer 108 can separate p-well region 104 from a set of source/drain regions 112 and a channel region 114 positioned between source/drain regions 112.

Source/drain regions 112 and channel region 114 of FET 110 may electrically couple a source terminal 116 of FET 110 to a drain terminal 118 when FET 110 is in an on state. A gate stack 120 can be positioned over channel region 114, such that a voltage applied to gate terminal 122 controls the electrical conductivity between source and drain terminals 116, 118 through source/drain regions 112 and channel region 114. Gate stack 120 can have, e.g., one or more electrically conductive metals therein, in addition to a gate dielectric material (indicated with white space between bottom of stack 120 and channel region 114) for separating the conductive metal(s) of gate stack 120 from at least channel region 114. In conventional settings, FET 110 would be the single electrically active component formed over a respective portion of substrate 102. Embodiments of the disclosure allow a P-N-P junction, and thus a BJT, to be formed in vertical alignment with FET 110. To form the P-N-P junction, biases may be applied to the various doped semiconductor materials (i.e., substrate 102 and regions 104, 106) in structure 100.

To apply independent biases to substrate 102, p-well region 104, and barrier region 106, embodiments of the disclosure may include forming conductive elements to each of the respective regions. To prevent electrical shorting and/or unintended biasing of nearby elements, structure 100 may include a group of trench isolations 124 for electrically and physically separating the various doped materials of structure 100 from each other. Trench isolations 124 may be composed of any insulating material such as $SiO_2$ or a "high-k" dielectric having a high dielectric constant, which may be, for example, above 3.9. In some situations, trench isolations 124 may be composed of an oxide substance. Trench isolations 124 may be formed by etching targeted portions of structure 100 to create openings and forming one or more insulative materials within the openings, e.g., by deposition.

As shown, trench isolations 124 may be positioned adjacent the interior vertical surfaces of barrier region 106. Trench isolations 124 may be formed to separate various contacts from each other and/or from other doped materials of structure 100. For example, structure 100 may include a first contact 126 to p-well region 104. First contact 126 may include one or more conductive materials formed on and/or partially within p-well region 104, e.g., one or more conductive metals and/or conductive silicide regions. First contact 126 additionally may include, e.g., refractory metal liners (not shown) to horizontally separate conductive materials of first contact 126 from trench isolations 124 and/or other horizontally adjacent materials. Such liners may include materials such as but not limited to: tantalum nitride (TaN) and tantalum; tantalum nitride, tantalum and cobalt; and magnesium (Mn), or combinations thereof.

A first voltage source 128 may be electrically coupled between an electrical ground GND and first contact 126 at least partially to apply a bias to p-well region 104. In the case of an FDSOI transistor architecture, first voltage source 128 may influence the initial conductivity between source/drain terminals 112 of FET 100 through channel region 114. Applying an electrical potential to first contact 126 can induce an electric charge within p-well region 104. The induced charge creates a difference in electrical potential between p-well region 104, source/drain regions 112, and channel region 114 across buried insulator layer 108. Among other effects, this difference in electrical potential between p-well region 104 and source/drain regions 112, channel region 114, can affect the threshold voltage of FET 110. The threshold voltage of FET 110 refers to the minimum voltage for inducing electrical conductivity across channel region 114 between source and drain terminals 112. Electrically biasing p-well region 104 may reduce or increase the threshold voltage required to operate FET 110. These characteristics of an FDSOI structure, among other things, can allow a reduced width (saving silicon area) relative to conventional applications and transistor structures.

In an example embodiment, a width of source/drain and channel regions 112, 114 (i.e., into and out of the plane of the page) can be between approximately 0.3 micrometers (μm) and approximately 2.4 μm. A length of source/drain and channel regions 112, 114 (i.e., left to right within the plane of the page) between source and drain terminals 116, 118 can be, e.g., approximately twenty nanometers (nm). FDSOI technology transistors, where included in structure 100, offer the ability to apply a bias to p-well region 104 to manipulate the threshold voltage $V_t$ (i.e., minimum voltage for channel formation) of FET 110. As noted herein, the bias applied to p-well region 104 may also be electrically coupled to other elements of structure 100 to provide additional functions and/or elements of structure 100.

The other doped materials of structure 100 may also include respective contacts and voltage sources coupled thereto. For example, a second voltage source 130 may be electrically coupled between ground GND and a second contact 132 to apply a respective bias to barrier region 106. A third voltage source 134 may be electrically coupled between ground GND and a third contact 136 to apply a respective bias to substrate 102. Each voltage source 128, 130, 134 may apply a respective bias substrate 102 and regions 104, 106 of structure 100. The biases applied from voltage sources 128, 130, 134 may induce a P-N junction between substrate 102 and barrier region 106, and another P-N junction between p-well region 104 and barrier region 106. The inclusion of voltage sources 128, 130, 134 may affect the type and orientation of diode connections formed by each P-N junction of structure 100.

In conventional IC structures, each region of doped semiconductor material (i.e., substrate 102, p-well region 104, barrier region 106) may have a same polarity, e.g., a reverse bias or less commonly a forward bias. In embodiments of structure 100, however, first voltage source 128 may apply a positive or negative bias to create a bias of opposite type to substrate 102 and barrier region 106. For example, second and third voltage sources 130, 134 each may apply a forward bias (indicated as $B_{R1}$ and $B_{R2}$ in FIG. 1) to barrier region 106 and substrate 102, respectively. However, first voltage source may apply an opposite polarity voltage to induce a forward bias $B_F$ to p-well region 104. Barrier region 106 being positioned between substrate 102 and p-well 104 causes multiple P-N junctions to form between the adjacent materials. Together, the two P-N junctions may define a P-N-P junction across p-well region 104, barrier region 106, and substrate 102. The P-N-P junction within structure 100 may be induced at least by applying a forward bias to p-well region 104 with first voltage source 128. Additionally, applying reverse biases to barrier region 106 with second voltage source 130, and substrate 102 with third voltage source 134, may help to induce the P-N-P junction across regions 104, 106 and substrate 102. The induced P-N-P junction may be positioned vertically below, and oriented perpendicularly to, channel region 114 of FET 110.

Figure 2:
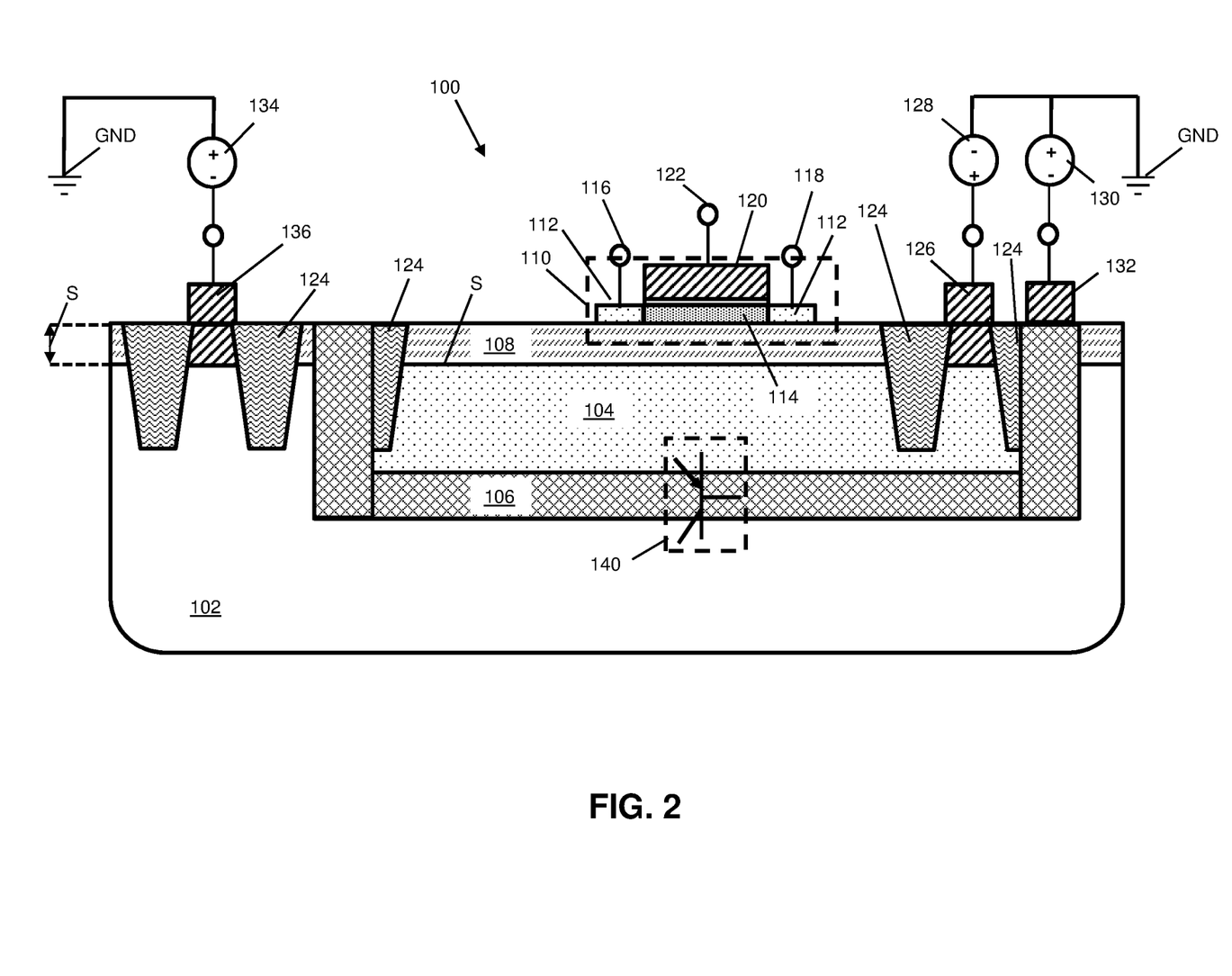
FIG. 2 shows a cross-sectional diagram of the IC structure with the P-N-P junction operating as a bipolar junction transistor (BJT) according to embodiments of the disclosure.

Referring to FIG. 2, the induced PH-N-P junction of structure 100 may be modeled as a BJT 140 (denoted with phantom lines) vertically aligned with FET 110. BJT 140 may be created in structure 100 as a result of voltage sources 128, 130, 134 applying respective biases to regions 104, 106 and substrate 102. In the art of electronics engineering, a BJT refers to a transistor having three semiconductor regions (known as an emitter, base, and collector) with alternating conductivity types (i.e., n-p-n or p-n-p). During operation, the current flow through a BJT may include majority and minority carriers (i.e., the current flow is "bipolar"). The properties of a BJT are controlled by its vertical dimensions, while the ability for current to flow between base and collector is controlled by current flow to the base. In the case of structure 100, the bias applied by each voltage source 128, 130, 134 will form one of the three BJT terminals. For example, the forward bias applied by first voltage source 128 to p-well region 104 may define the emitter terminal of BJT 140. In this case, the reverse bias applied by second voltage source 130 to barrier region 106 may define the base terminal of BJT 140, and the reverse bias applied by third voltage source 134 to substrate 102 may define the collector terminal of BJT 140. As shown, BJT 140 is vertically aligned with FET 110 because BJT 140 includes a horizontal interface between substrate 102 and barrier region 106, and another horizontal interface between p-well region 104 and barrier region 106, each of which are positioned vertically below FET 110.

Figure 3:
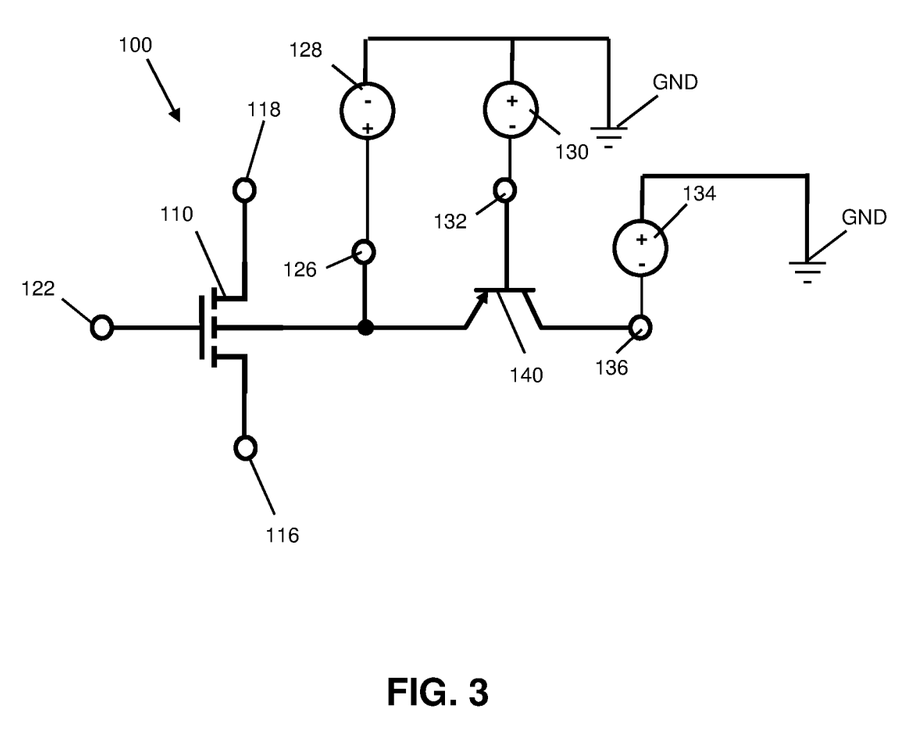
FIG. 3 shows a schematic circuit model illustrating the IC structure during operation according to embodiments of the disclosure.

Referring to FIGS. 2 and 3, BJT 140 may operate substantially independently of FET 110 despite also being formed in substrate 102, and more generally in the same device layer of structure 100. The schematic diagram of structure 100 indicates the operational relationship between FET 110 and BJT 140 of structure 100. As discussed previously, FET 110 may include source terminal 116, drain terminal 118, and gate terminal 122 for controlling the flow of current across source and drain terminals 116, 118. As also discussed herein, first voltage source 128 may be coupled through first contact 126 to semiconductor material defining a back-gate terminal (e.g., p-well region 106) of FET 110.

First voltage source 128, by applying a reverse bias as described herein, may induce a P-N-P junction across p-well region 104, barrier region 106, and substrate region 102 to form BJT 140. In this case, first contact 126 may define an emitter terminal of BJT 140, while second contact 132 and third contact 136 may define respective base and collector contacts of BJT 140. Due to this arrangement, first contact 126 may provide unitary control over the back-gate bias of FET 110 in addition to the emitter-collector current of BJT 140. This attribute of structure 110 may provide the sole operational interaction between FET 110 and BJT 140 of structure 100. Due to FET 110 and BJT 140 each including p-well region 104 therein, applying a back-gate bias to FET 110 through first contact 126 will also apply an emitter-collector current through BJT 140 and vice versa. This interrelationship is shown in the schematic view of FIG. 3, e.g., by the back-gate terminal of FET 110 and the collector terminal of BJT 140 including a single, shared node at first contact 126.

Figure 4:
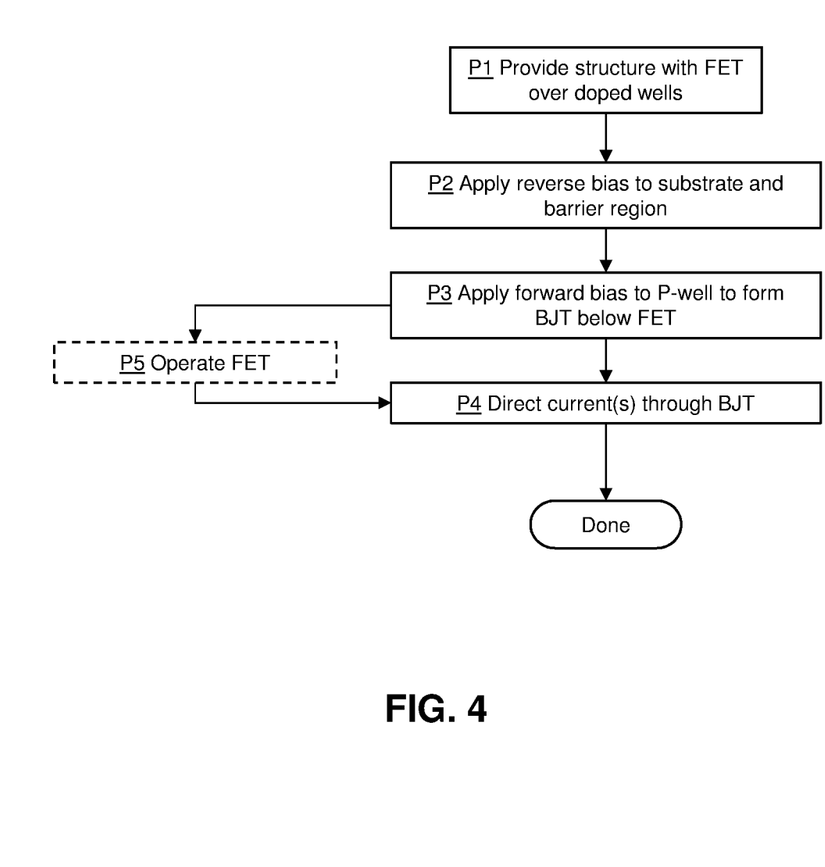
FIG. 4 provides an illustrative flow diagram of a method to operate a BJT in vertical alignment with a FET according to embodiments of the disclosure.

Referring now to FIGS. 2 and 4 together, embodiments of the disclosure provide a method to operate BJT 140 in vertical alignment with FET 100 as discussed herein. Although FIG. 4 provides a flow diagram illustrating such a method according to a non-limiting example, it is understood that the various processes depicted in the flow diagram of FIG. 4 may be implemented in an alternative order, with various additional processes optionally implemented where desired, and/or with any other conceivable modification while providing one or more of the various operational characteristics and advantages noted herein. Process P1 of a method according to the disclosure may include, e.g., providing structure 100 with substrate 102 (e.g., a p-type substrate) and p-well region 104 with upper surface in alignment with the upper surface of substrate 102. Structure 100 may also include barrier region 106 directly between substrate 102 and p-well region 104 to physically isolate the two other doped materials, and buried insulator layer 108 to physically separate the overlying FET 110 from the various doped semiconductor materials. The providing of structure 100 in process P1 may include, e.g., fabricating structure 100 according to any currently known or later developed combination of integrated circuit manufacturing processes (e.g., various instances of deposition, etching, etc.) In various further embodiments, process P1 may include obtaining structure 100 from another source and/or implementing only some processes to form the various elements of structure 100.

Methods of the disclosure may include, e.g., applying a reverse bias to only substrate 102 and barrier region 106. As compared to conventional methods to operate IC structures with doped semiconductor regions, embodiments of the disclosure may apply different biases to different sets of doped semiconductor materials to form BJT 140 beneath FET 110. Embodiments of the disclosure may include applying a reverse bias to substrate 102 and barrier region 106 without applying the reverse bias to p-well region 104. The reverse bias may create two reverse biases $B_{R1}$, $B_{R2}$ (FIG. 1) in each of substrate 102 and barrier region 106 to thereby define base and collector terminals of BJT 140. To form the remaining terminal of BJT 140, embodiments of the disclosure in process P3 may include applying a forward bias (i.e., a bias of opposite polarity to the biases applied in process P2) to p-well region 104.

The applied forward bias will induce a P-N-P junction across substrate 102, barrier region 106, and p-well region 104 to create BJT 140 as noted elsewhere herein. The induced P-N-P junction may extend at least partially perpendicularly with respect to the current path through channel region 114 of FET 110. The applied forward bias may concurrently be an applied back-gate bias to FET 110, which may affect the threshold voltage of FET 110. In any case, the method may continue to process P4 of directing currents across BJT 140 as the biases remain applied to substrate 102, barrier region 106, and p-well region 104. Additionally, methods according to the disclosure may include process P5 of operating FET 110 while continuing to apply a forward bias to p-well region 104, thus using the operation of BJT 140 to influence the threshold voltage of FET 110.

Embodiments of the disclosure may provide several technical and commercial advantages, some of which here discussed herein by way of example. The various IC structures and methods according to the disclosure allow a FET to be vertically stacked above a BJT in a single device layer. In conventional IC structures, it is typically necessary to form various transistor types in horizontally separated areas of a single device layer, and/or to form multiple device layers for each of the different components. Additionally, embodiments of the disclosure allow a single bias to simultaneously affect the threshold voltage of a FET, e.g., in the case of an FDSOI transistor, and drive the operation of a BJT positioned in doped semiconductor materials below the FET. When implemented in an IC structure, embodiments of the disclosure may reduce the total surface area occupied by transistor components in a design, thereby further improving device density and reducing the surface area required to implement various IC designs.

The descriptions of the various embodiments of the present n have been presented for purposes of illustration, but are not intended to be exhaustive or limited to the embodiments disclosed. Many modifications and variations will be apparent to those of ordinary skill in the art without departing from the scope and spirit of the described embodiments The terminology used herein was chosen to best explain the principles of the embodiments, the practical application or technical improvement over technologies found in the marketplace, or to enable others of ordinary skill in the art to understand the embodiments disclosed herein.

What is claimed is:

1. An integrated circuit (IC) structure, comprising:
   a p-type substrate;
   a p-well region within the p-type substrate;
   an n-type barrier region between the p-type substrate and the p-well region, wherein the n-type barrier region physically isolates the p-type substrate from the p-well region;
   a field effect transistor (FET) above the p-well region, wherein a buried insulator layer separates the FET from the p-well region, and an upper surface of the n-type barrier region is substantially coplanar with an upper surface of the buried insulator layer; and
   a first voltage source electrically coupled to the p-well region inducing a P-N-P junction across the p-well region, the n-type barrier region, and the p-type substrate,
   wherein the p-well region defines an emitter terminal of a bipolar junction transistor (BJT), the n-type barrier region defines a base terminal of the BJT, and the p-type substrate defines a collector terminal of the BJT,
   wherein the first voltage source concurrently applies a forward bias to the p-well region and applies a back-gate bias to the FET to adjust a threshold voltage of the FET.

2. The IC structure of claim 1, wherein the p-well region has an upper surface substantially aligned with an upper surface of the p-type substrate.

3. The IC structure of claim 1, wherein the P-N-P junction is oriented substantially perpendicularly with respect to a channel region of the FET.

4. The IC structure of claim 1, further comprising:
   a second voltage source coupled to the n-type barrier region; and
   a third voltage source coupled to the p-type substrate.

5. The IC structure of claim 1, wherein the P-N-P junction forms the bipolar junction transistor (BJT) within the p-type substrate.

6. The IC structure of claim 4, wherein the P-N-P junction forms the bipolar junction transistor (BJT) within the p-type substrate and wherein the first voltage source is electrically coupled to the p-well through an emitter contact of the BJT, the second voltage source is electrically coupled to the n-type barrier region through a base contact of the BJT, and the third voltage source is electrically coupled to the p-type substrate through a collector contact of the BJT.

7. The IC structure of claim 4, wherein the second voltage source applies a first reverse bias to the n-type barrier region concurrently with the forward bias, and wherein the third voltage source applies a second reverse bias to the p-type substrate concurrently with the forward bias.

8. The IC structure of claim 1, further comprising a plurality of trench isolations that extend through the buried insulator layer and at least partially into the p-well region.

9. The IC structure of claim 1, wherein the back-gate bias to the FET is a positive voltage bias.

10. An integrated circuit (IC) structure comprising:
    a bipolar junction transistor (BJT) including:
    a p-type substrate;
    a p-well region within the p-type substrate;
    an n-type barrier region between the p-type substrate and the p-well region, wherein the n-type barrier region physically isolates the p-type substrate from the p-well region;
    a first voltage source electrically coupled to the p-well region inducing a P-N-P junction across the p-well region, the n-type barrier region, and the p-type substrate;
    a buried insulator layer above the p-well region of the BJT, wherein an upper surface of the buried insulator layer is substantially coplanar with an upper surface of the n-type barrier region; and
    a field effect transistor (FET) on the buried insulator layer above the p-well region, and including a semiconductor channel region above the buried insulator layer, wherein the semiconductor channel is positioned vertically above the P-N-P junction,
    wherein the p-well region defines an emitter terminal of the BJT, the n-type barrier region defines a base terminal of the BJT, and the p-type substrate defines a collector terminal of the BJT,
    wherein the first voltage source concurrently applies a forward bias to the p-well region and applies a back-gate bias to the FET to adjust a threshold voltage of the FET.

11. The IC structure of claim 10, wherein the p-well region has an upper surface substantially aligned with an upper surface of the p-type substrate.

12. The IC structure of claim 10, wherein the P-N-P junction is oriented substantially perpendicularly with respect to the semiconductor channel of the FET.

13. The IC structure of claim 10, wherein the BJT further includes:
    a second voltage source coupled to the n-type barrier region; and
    a third voltage source coupled to the p-type substrate.

14. The IC structure of claim 13, wherein the first voltage source is electrically coupled to the p-well through an emitter contact of the BJT, the second voltage source is electrically coupled to the n-type barrier region through a base contact of the BJT, and the third voltage source is electrically coupled to the p-type substrate through a collector contact of the BJT.

15. The IC structure of claim 10, wherein the FET further includes:
    a gate stack defining a gate terminal of the FET; and
    a source/drain contact defining a source terminal or a drain terminal of the FET,
    wherein the first voltage source operates independently of the gate stack and the source/drain contact.

16. A method to form a bipolar junction transistor (BJT) in vertical alignment with a field effect transistor (FET), the method comprising:
    providing a structure including:
    a p-type substrate,
    a p-well region within the p-type substrate,
    an n-type barrier region between the p-type substrate and the p-well region, wherein the n-type barrier region physically isolates the p-type substrate from the p-well region,
    a buried insulator layer above the substrate, wherein an upper surface of the buried insulator layer is substantially coplanar with an upper surface of the n-type barrier region, and
    a field effect transistor (FET) above the buried insulator layer;
    applying a first voltage to concurrently apply a forward bias to the p-well region and apply a back-gate bias to the FET to adjust a threshold voltage of the FET, wherein applying the forward bias induces a P-N-P junction across the p-well region, the n-type barrier region, and the p-type substrate, wherein the p-well region defines an emitter terminal of the BJT, the n-type barrier region defines a base terminal of the BJT, and the p-type substrate defines a collector terminal of the BJT.

17. The method of claim 16, wherein applying the forward bias causes the P-N-P junction to be oriented substantially perpendicularly with respect to a channel region of the FET.

18. The method of claim 16, further comprising applying a first reverse bias to the n-type barrier region concurrently with the forward bias; and applying a second reverse bias to the p-type substrate concurrently with the forward bias.

19. The method of claim 16, wherein the first reverse bias enables current flow across the n-type barrier region between the p-well region and the p-type substrate.

20. The method of claim 16, further comprising applying a gate bias to the FET, wherein the gate bias is independent of the forward bias.

* * * * *